United States Patent
Palata

(10) Patent No.: US 6,778,132 B2
(45) Date of Patent: Aug. 17, 2004

(54) MICROWAVE SENSOR

(75) Inventor: Jaromir Palata, Friedrichshafen (DE)

(73) Assignee: i f m electronic GmbH, Essen (DE)

( * ) Notice: Subject to any disclaimer, the term of this patent is extended or adjusted under 35 U.S.C. 154(b) by 0 days.

(21) Appl. No.: 10/365,691

(22) Filed: Feb. 13, 2003

(65) Prior Publication Data
US 2004/0095270 A1 May 20, 2004

(30) Foreign Application Priority Data
Feb. 13, 2002 (DE) ........................ 102 06 074.6

(51) Int. Cl.$^7$ .............................................. G01S 7/28
(52) U.S. Cl. ...................... 342/175; 342/28; 455/332
(58) Field of Search ........................... 342/175, 27, 28; 343/700 MS; 455/85, 90.3, 323, 326, 327, 332, 333

(56) References Cited

U.S. PATENT DOCUMENTS

| | | | | |
|---|---|---|---|---|
| 2,516,990 A | * | 8/1950 | Herold | 455/326 |
| 2,789,210 A | * | 4/1957 | Arnold | 455/75 |
| 5,465,418 A | * | 11/1995 | Zhou et al. | 455/332 |
| 5,963,850 A | * | 10/1999 | Foster | 455/67.15 |

FOREIGN PATENT DOCUMENTS

| | | | | |
|---|---|---|---|---|
| DE | 32 09 093 A1 | | 9/1983 | |
| DE | 41 27 892 A1 | | 2/1993 | |
| DE | 10306194 A1 | * | 11/2003 | G01S/7/02 |
| EP | 1339165 A1 | * | 8/2003 | H03B/5/18 |

* cited by examiner

Primary Examiner—John B. Sotomayor
(74) Attorney, Agent, or Firm—Nixon Peabody LLP; David S. Safran

(57) ABSTRACT

A microwave sensor is described, with a self-mixing oscillator (1), with a transmitting and receiving antenna (2), with an impedance (3) which is connected between the current or voltage supply (4) and the oscillator (2), and with an evaluation circuit (5), the self-mixing oscillator (2) producing both the transmitted signal and also mixing the transmitted signal with the received signal and the low-frequency mixed (Doppler signal) being tapped on the impedance (3) and supplied to the evaluation circuit (5).

Figure 1:
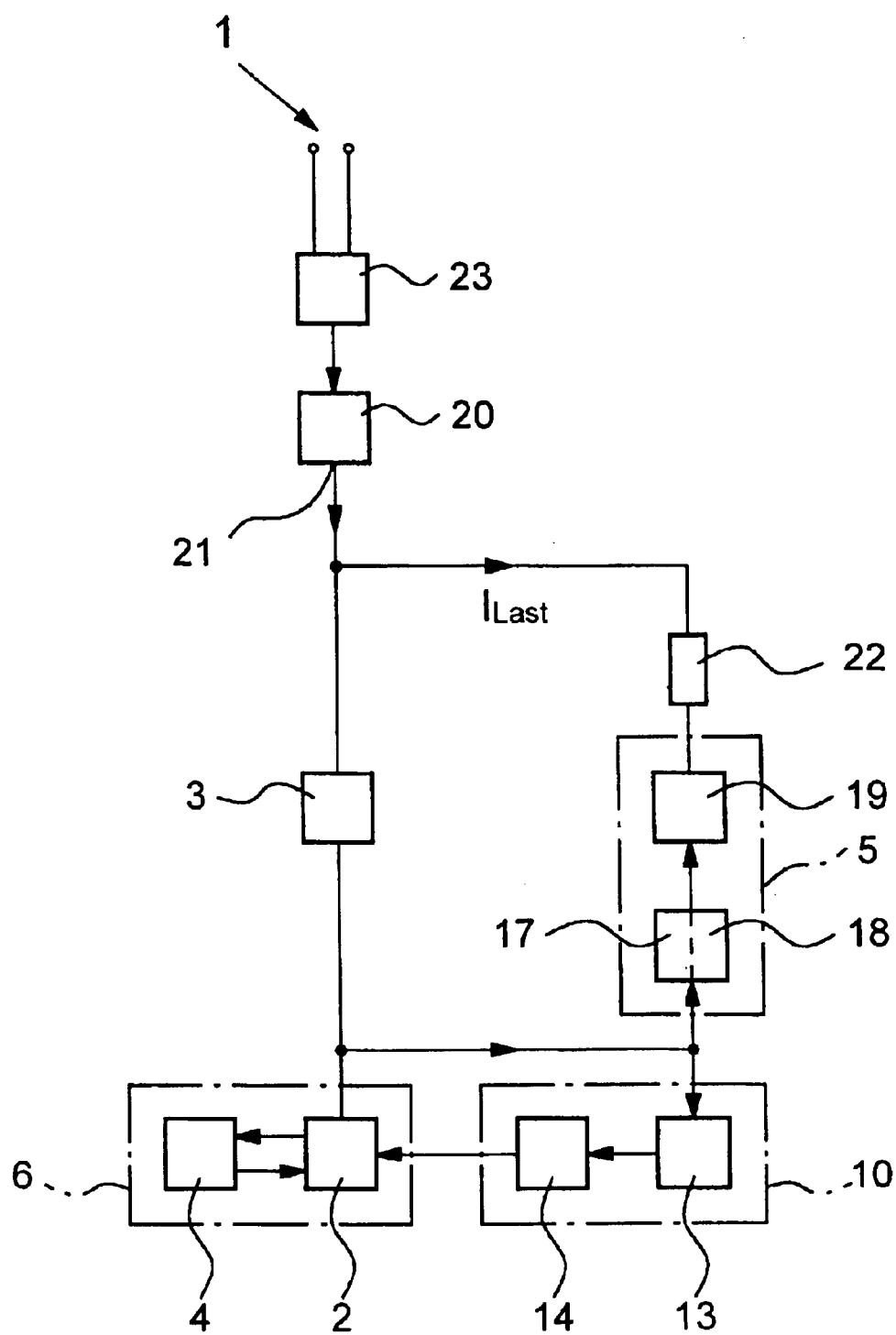

The microwave sensor has only lower power consumption, and the microwave sensor can also be economically produced in that the self-mixing oscillator (2) is made as a push-pull oscillator with two transistors (6, 7).

16 Claims, 5 Drawing Sheets

MICROWAVE SENSOR

The invention relates to a microwave sensor with a current or voltage supply, with a self-mixing oscillator, with an impedance which is connected between the current or voltage supply and the oscillator, with a transmitting and receiving antenna and with an evaluation circuit, the self-mixing oscillator producing both the transmitted signal and also mixing the transmitted signal with the received signal and the low-frequency mixed product being tapped on the impedance and supplied to the evaluation circuit.

In the first type of microwave sensors of the above described type, the movement of an article in an area to be monitored is ascertained by the so-called Doppler effect being evaluated. A transmitted signal radiated by the transmitter with a frequency $f_1$ is reflected by an object moving in the area to be monitored. Part of the reflected signal is incident as the received signal with a frequency $f_2$ on the receiver. In a suitable mixer the received signal is mixed with the transmitted signal and then the portion of the mixed product with the Doppler frequency $f_D$ is evaluated. The following equations apply to the Doppler frequency $f_D$ $$f_D = f_1 - f_2 \text{ and}$$

$$f_D = [(2 \times f_1)/c_0] \times v_r$$

$c_0$ being the velocity of light and $v_r$ being the radial velocity of the moving object.

Thus either the radial velocity $v_r$ of the moving object can be measured from the measured Doppler frequency $f_D$ or, if the microwave sensor is used only for monitoring a space or a certain area, the entry of an object into the space or area to be monitored can be ascertained. One such microwave sensor which evaluates the Doppler effect and which is often also called a Doppler sensor can thus be used as a motion detector for the most varied applications.

In a second type of microwave sensors of the above described type for detection of a moving or stationary object in an area which is to be monitored, a frequency-modulated transmitted signal with a frequency $f_1(t)$ is emitted by a transmitter. The modulation signal is produced in doing so by a suitable modulation generator, and the frequency $f_1(t)$ of the transmitted signal can change linearly, sinusoidally or according to another time function. This radar process is called FMCW radar (FMCW=frequency modulated continuous wave).

Here the transmitted signal with a frequency $f_1(t_0)$ is reflected by an object which is located in the area to be monitored. Part of the reflected signal after a time interval $\Delta t$ is incident as the received signal with frequency $f_1(t_0)$ on the receiver. At this time the transmitted signal already has the frequency $f_1(t_0+\Delta t)$. The received signal in its frequency thus runs behind that of the transmitted signal. In a suitable mixer the received signal is mixed with the transmitted signal and then the portion of the mixed product with frequency $f_{IF}$ is evaluated.

The microwave sensor under consideration can be used both as a Doppler sensor and also as a FMCW sensor. In doing so the frequency of the transmitter depending on the application can be between 60 MHz and 60 GHz and thus also somewhat below the actual microwave range which normally extends from 300 MHz to 300 GHz. Strictly speaking, the sensor under consideration is a radio or microwave sensor.

It was stated at the beginning that the microwave sensor has a self-mixing oscillator and a transmitting and receiving antenna. A self-mixing oscillator, which can also be called a self-oscillating mixer, is a component which is used both as an oscillator and also as a mixer. On the one hand, therefore either the self-mixing oscillator produces a transmitted signal, on the other in the self-mixing oscillator which then operates as a self-oscillating mixer, the received signal is mixed with the transmitted signal. Within the framework of this application a transmitting and receiving antenna is defined as a component which is used at the same time as a transmitting antenna and as a receiving antenna.

One such microwave sensor in which instead of the four components—oscillator, mixer, transmitting antenna and receiving antenna—only the above described two components—a self-mixing oscillator and transmitting and receiving antenna are used, is disclosed by DE 32 09 093 A1 and DE 41 27 892 A1. In the known microwave sensors the self-mixing oscillator is formed by a feedback field effect transistor with a resistor for tapping the Doppler signal in its source-drain circuit. With the known microwave sensor it has already been possible to make available a device for space monitoring by means of Doppler radar which requires only relatively few components and therefore can be produced both economically and also has only little space requirement and low weight.

Especially when one such microwave sensor is made as a 2-wire device or is to be battery-operated is there however the problem that the known microwave sensors have an overly great power consumption or at low power consumption have an overly low transmitted power. One such microwave sensor made as a 2-wire device can also be called a microwave proximity switch.

Therefore the object of this invention is to improve the initially described microwave sensor such that it has lower power consumption and can be produced as economically as possible.

This object is first achieved in the initially described microwave sensor essentially in that the self-mixing oscillator is made as a push-pull oscillator with two transistors.

The use of a push-pull oscillator has the advantage that in this way higher power and better efficiency can be achieved so that one such push-pull oscillator builds-up well even at a relatively low voltage or relatively low current. In particular a symmetrically built push-pull oscillator compared to known field effect transistors used as self-mixing oscillators is much more oscillation-friendly, additionally few harmonics also occurring.

The transmitting and receiving antenna is advantageously formed by a strip line which determines the frequency of the oscillator. By using a strip line as the transmitting and receiving antenna which is a component of the push-pull oscillator it is possible to save another component, since a separate transmitting and receiving antenna is no longer necessary. In addition, however it is also possible to use a dipole antenna as the transmitting and receiving antenna.

According to one preferred embodiment of the microwave sensor as claimed in the invention, to adjust or stabilize the working point of the microwave sensor, voltage countercoupling with at least one resistor and one lowpass is accomplished.

In the Doppler sensor known from DE 41 27 892 A1, to stabilize the working point of the transistor, current countercoupling is implemented, for which between the drain terminal and the gate terminal of the field effect transistor and ground one impedance at a time is connected. This current countercoupling for adjusting the working point leads on the one hand to an undesirable cross current; this increases the energy demand of the microwave sensor which is required overall. On the other hand, when the working point is adjusted by means of current countercoupling there is the danger that the useful signal, i.e. the Doppler signal, is "regulated out" or at least attenuated by countercoupling.

Because the working point is adjusted by voltage countercoupling, first of all an unwanted cross current is avoided. In addition, the lowpass which is provided ensures that only possible temperature drift is corrected, but the Doppler signal is not attenuated. To do this, the lowpass is adjusted such that working point control is slower than the lowest expected Doppler frequency $f_D$ or the lowest intermediate frequency $f_{IF}$. In a transmitted signal with a frequency $f_1$ of a few gigahertz, for example 2.5 GHz, and tuning of the microwave sensor to movements executed by individuals, for example a hand approaching a doorknob, the Doppler frequency $f_D$ is for example between 10 and 50 Hz so that the cutoff frequency of the lowpass must accordingly be chosen to be smaller than 10 Hz. Preferably the cutoff frequency of the lowpass is roughly ⅓ of the lowest expected Doppler frequency $f_D$ or the lowest intermediate frequency $f_{IF}$. When the working point is adjusted or stabilized in this way, only very few components are needed. In particular, the resistor which is used for voltage countercoupling can be at the same time also a component of the lowpass. Then only one resistor and one, preferably two capacitors are needed for working point control.

In one alternative embodiment of the microwave sensor as claimed in the invention, the working point is stabilized or adjusted using current control with at least one lowpass. The lowpass ensures in turn that only possible temperature drift is corrected, but the Doppler signal or the intermediate signal is not attenuated. The current is controlled via changing the base current of the oscillator transistors of the push-pull oscillator. Here the working point control can be connected directly to the bases of the oscillator transistor or to the middle terminal of the strip line.

According to another embodiment of the invention, the working point is controlled using a comparator and a lowpass or an integrator. The comparator is for example a correspondingly wired operational amplifier. Control which has been structured in this way takes place with a frequency which is smaller than the smallest expected Doppler frequency $f_D$. Since only possible temperature drift of the transistors is to be compensated by working point adjustment or control—the base emitter voltage of a transistor belonging to a given collector current decreases by roughly 2 mV per degree of temperature increase—working point control with a frequency of only a few hertz is sufficient.

It was stated at the beginning that the microwave sensor has an impedance which is connected between the current or voltage supply and the self-mixing oscillator, the Doppler signal being tapped on the impedance and supplied to the evaluation circuit. If the microwave sensor as claimed in the invention is to have only minimum power consumption and is to be built with costs as low as possible and thus also with as few components as possible, the impedance can be easily made as an ohmic resistance. One such microwave sensor is especially suited for battery operation since the microwave sensor then only has a power consumption of less than 0.5 mA. Based on the very oscillation-friendly push-pull oscillator, even a lower current for operation of the self-mixing oscillator is sufficient One such microwave sensor can be integrated in the door handle of a motor vehicle where the microwave sensor establishes the approach of a hand to the door handle and upon response activates a transponder for interrogation of the access authorization. Likewise, one such microwave sensor can be used as a proximity sensor in sanitation systems—toilet flushing or hand driers—or in pedestrian traffic lights. With one such microwave sensor which is optimized to minimum power consumption and which in addition also has only very small dimensions, only a very small range of a few centimeters—up to roughly 10 to 20 cm—can be implemented so that the microwave sensor can also monitor only a correspondingly small area of space which is however sufficient for the aforementioned applications.

If a greater range is to be achieved with the microwave sensor, but the power consumption is to be kept as small as possible, advantageously an impedance is used which has a frequency-dependent resistance. The impedance is designed such that it is low-resistance for the DC voltage or direct current supply of the self-mixing oscillator, but is as high-resistance as possible for the Doppler signal or the intermediate signal. One such impedance can be formed for example by a constant current source.

The use of an impedance with the above described frequency-dependent resistance has the advantage that on the one hand a relatively large amount of current can be supplied to the transistors of the push-pull oscillators due to the low resistance for direct current power supply so that a relatively high transmitted power is available. On the other hand, one such impedance due to its high resistance for the Doppler signal has the advantage that high gain is achieved.

One such impedance can also be implemented by a reactor, especially an electronic reactor, for example a gyrator. A gyrator has the advantage that it has very low resistance for direct current supply for the LF signal, but is very high resistance for HF signals; this leads to the desired high gain of the useful signal.

To increase the frequency stability of the push-pull oscillator, the strip line can be connected to a dielectric resonator. One such dielectric resonator then due to its high quality assumes frequency guidance of the push-pull oscillator. The use of a dielectric resonator is advantageous especially when the microwave sensor is to be used in the immediate vicinity of other electronic devices and circuits, so that it must be ensured that these electronic devices and circuits are not adversely affected by the radiated transmitted signal.

The strip line is made advantageously as a λ/2 (lambda half) microstrip line. The tuning of the length of the microstrip line to the frequency $f_1$ of the transmitted signal has the advantage that when the length of the microstrip line is chosen according to half the wavelength of the transmitted signal, the voltage zero point of the sinusoidal transmitted signal is in the geometric middle of the microstrip line, by which the connection for working point control can be easily accomplished, especially reactors for injection are not necessary. To improve the directional characteristic of the strip line it has a back copper coating, by which the emission characteristic of the strip line corresponds roughly to an ellipsoid of rotation.

Basically there are various possibilities for embodying the evaluation circuit to which the Doppler signal is sent. According to one preferred embodiment of the invention the evaluation circuit has at least one amplifier, at least one bandpass and at least one comparator.

The bandpass is set to the expected frequency $f_D$ of the Doppler signal in the range from 10 to 40 Hz so that both noise and also 50 Hz hum can be suppressed by the bandpass. Due to the relatively low frequency $f_D$ of the Doppler signal which is to be evaluated, the amplifier which is advantageously made as two-stage operational amplifier has only a low power consumption. To ensure response of the microwave sensor as fast as possible, the comparator is made preferably as a window comparator so that the comparator has two thresholds, both a positive and also a negative threshold. In this way, any motion of an object within the monitored area immediately produces a signal at the output of the comparator, regardless of the direction of motion. The use of an evaluation circuit with a window comparator moreover has the advantage that the window comparator can be wired such that it works without a closed-circuit current. Only when the microwave sensor is actuated, i.e. when an object is moving in the monitored area of the microwave sensor, does a load current flow through the window comparator.

Using a voltage regulator which is connected between the current or voltage supply and the impedance, with a load resistor connected to its output, the use of an otherwise more complex end stage can be omitted. When the microwave sensor is actuated so that the window comparator becomes conductive and thus a load current flows via the load resistor, a voltage dip of the voltage regulator associated with it is immediately compensated by a corresponding increase of current. Since the load resistor is connected to the output of the voltage regulator, the current which flows when the microwave sensor is actuated is exactly defined.

In particular there is a host of possibilities for embodying and developing the microwave or radio wave sensor as claimed in the invention. In this regard reference is made both to the claims which are subordinate to claim 1 and also to the description of preferred embodiments in conjunction with the drawings.

Figure 2A:
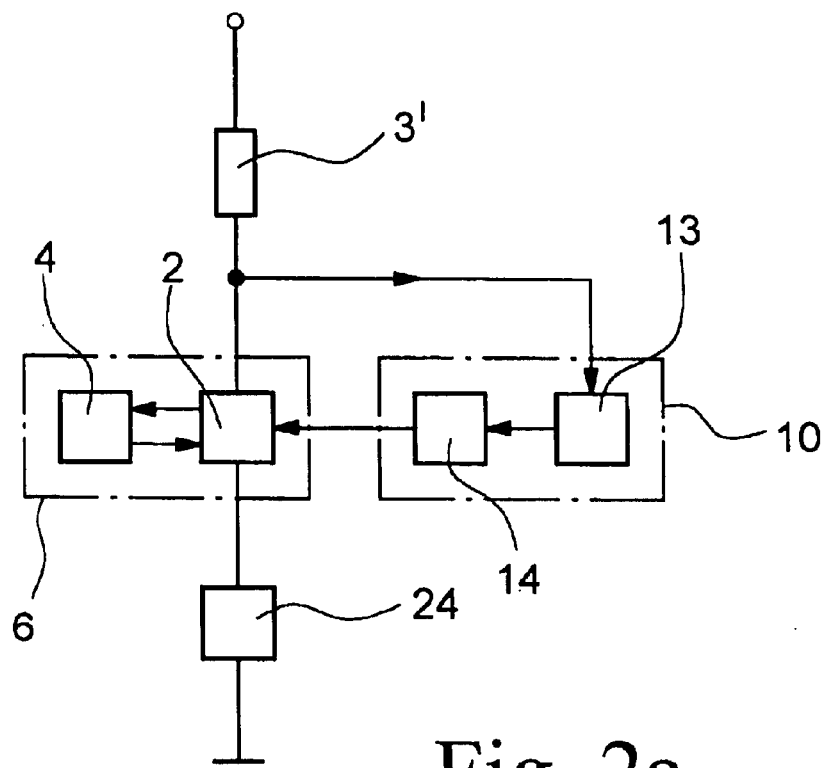
Figure 2B:
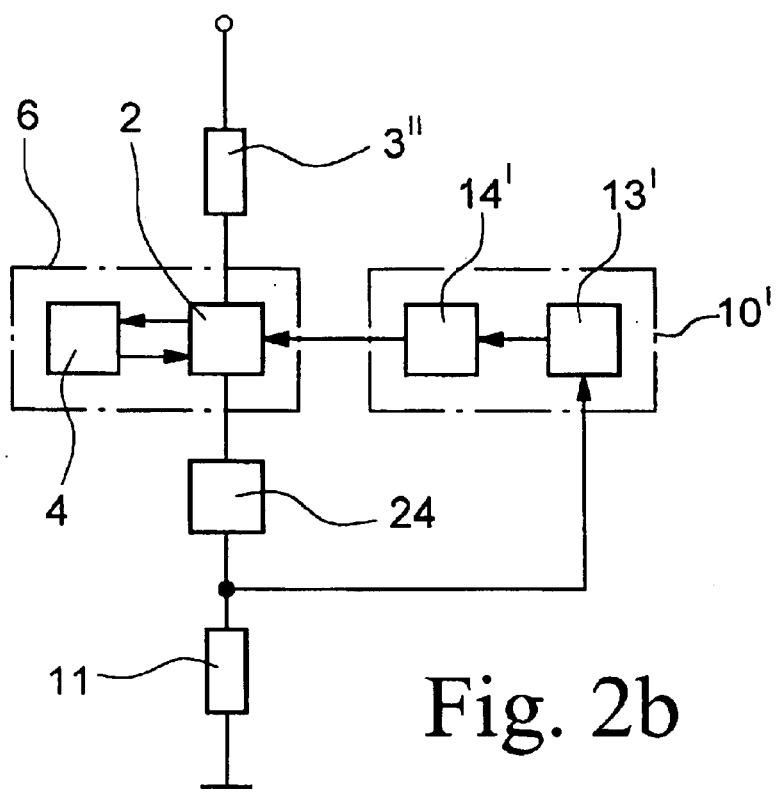
Figure 3:
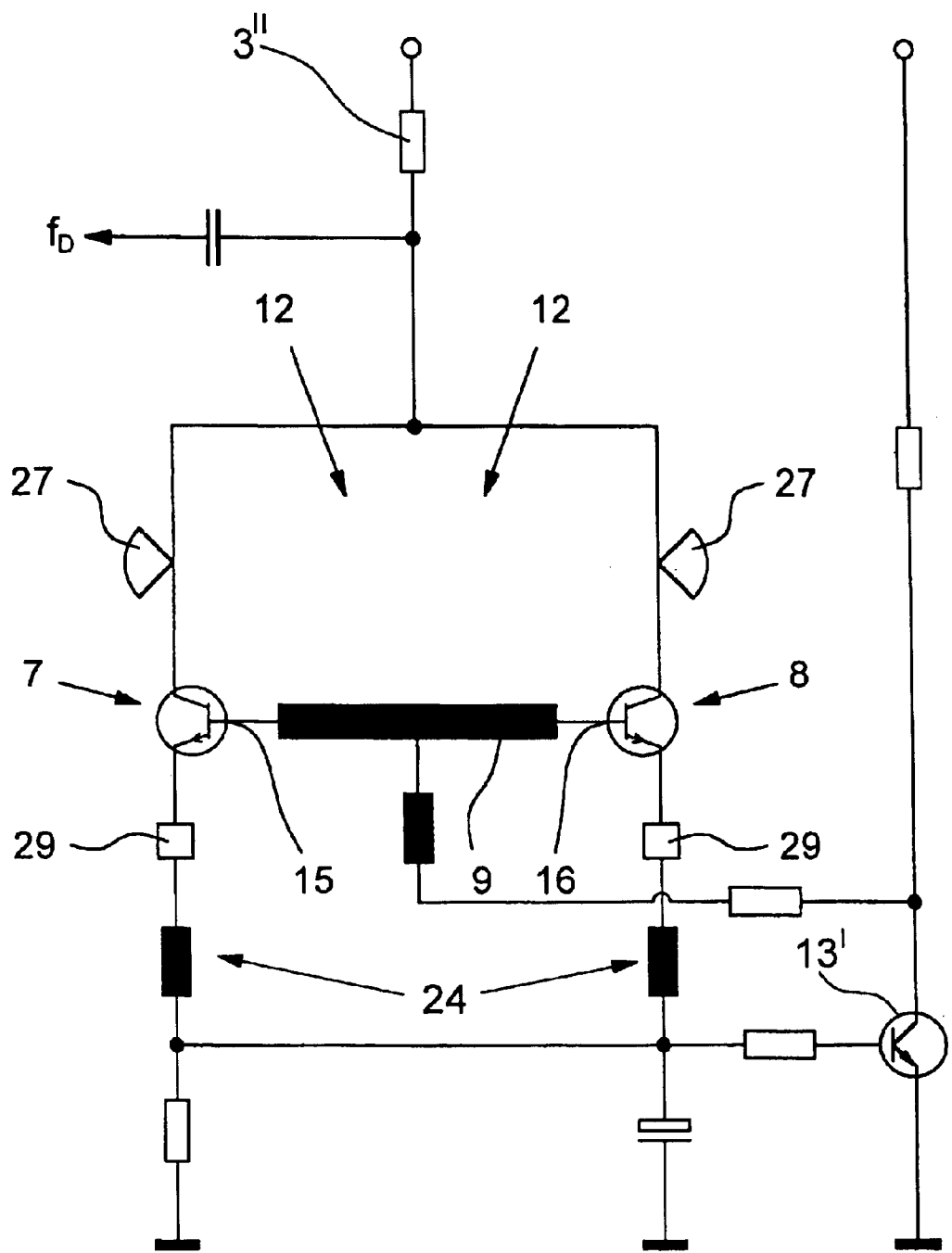
Figure 4:
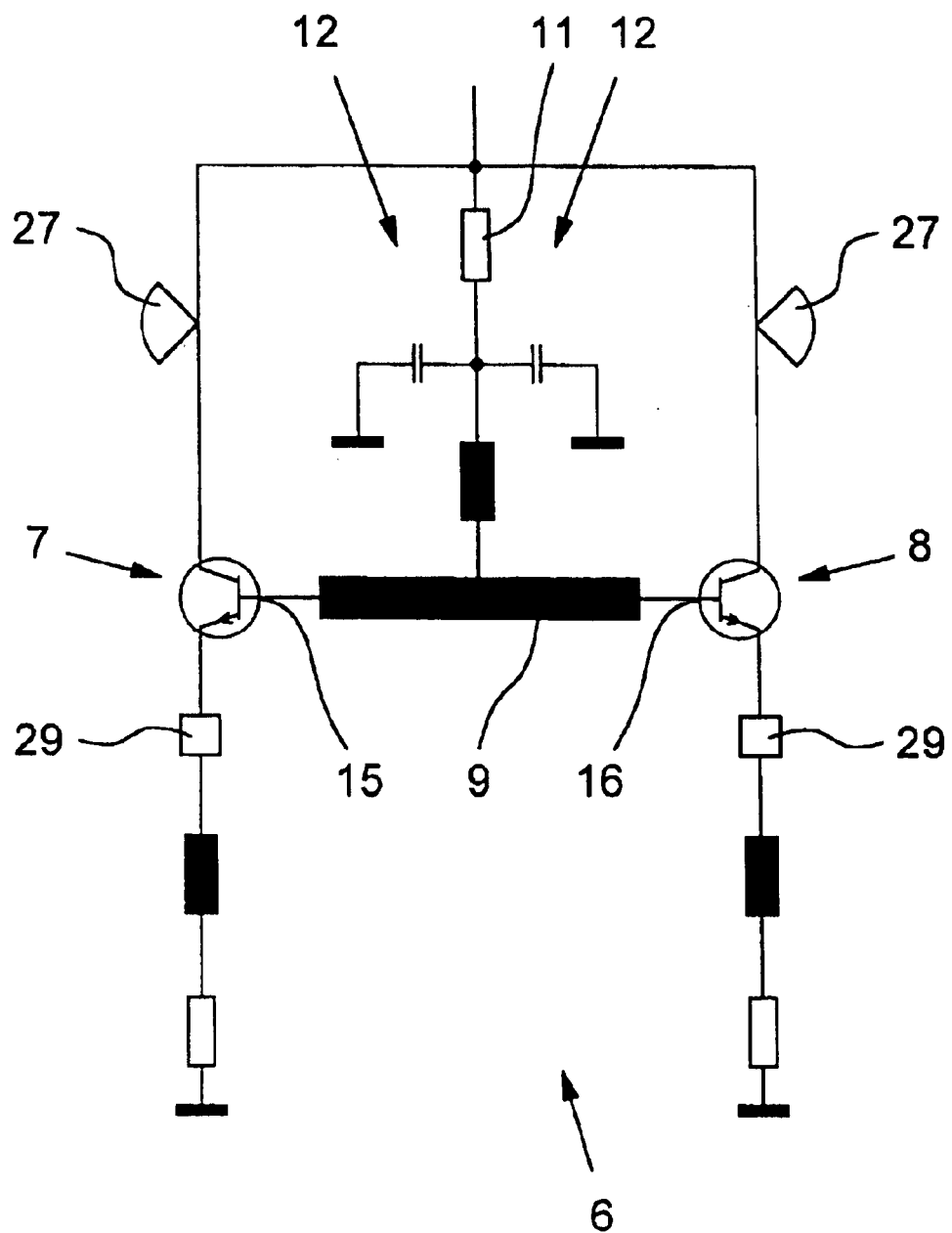
Figure 5:
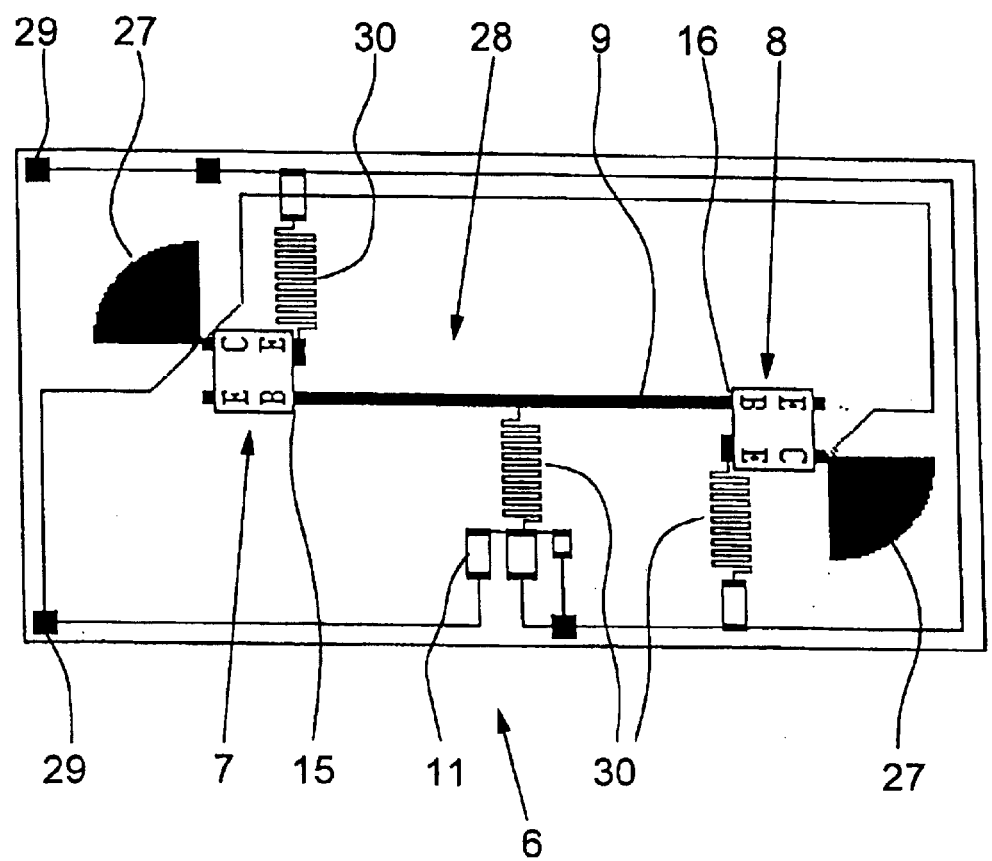

FIG. 1 shows an elementary diagram of one embodiment of the microwave sensor as claimed in the invention, FIG. 2a shows an elementary diagram of part of a microwave sensor as shown in FIG. 1, FIG. 2b shows an elementary diagram of part of one alternative embodiment of the microwave sensor as claimed in the invention, FIG. 3 shows a block diagram of part of the microwave sensor as shown in FIG. 2b, FIG. 4 shows a block diagram of a microwave module of the microwave sensor and FIG. 5 shows a structure of the microwave module as shown in FIG. 4.

According to the elementary diagram shown in FIG. 1, the microwave sensor as claimed in the invention has a current or voltage supply 1, a self-mixing oscillator 2, an impedance 3 which is connected between the current or power supply 1 and the self-mixing oscillator 2, a transmitting and receiving antenna 4 and an evaluation circuit 5. The self-mixing oscillator 2, which produces both the transmitted signal and also mixes the transmitted signal with the received signal, forms together with the transmitting and receiving antenna 4 the high frequency microwave module 6, of which FIG. 4 shows a block diagram and FIG. 5 shows a layout diagram.

FIGS. 4 and 5 show that the self-mixing oscillator 2 is made as a symmetrical push-pull oscillator with two bipolar transistors 7, 8 and the transmitting and receiving antenna 4 is formed by a strip line 9. The strip line 9, which is made as a λ/2 microstrip line, is connected with its two ends each to the base terminal 15 and 16 of the two bipolar transistors 7, 8.

In the microwave module 6 which is shown in FIGS. 4 and 5 and which is made and structured such that the microwave sensor has only minimum power consumption, and to set or stabilize the working point of the transistors 7, 8, voltage countercoupling 10 is accomplished with one resistor 11 and two lowpasses 12. For the two lowpasses 12 of the two transistors 7 and 8 the same resistor 11 is used as also is used for voltage countercoupling as well.

One alternative embodiment of voltage countercoupling 10 which consists of one voltage comparator 13 and one integrator 14 is only suggested in FIG. 1. The integrator 14 is used, in the same way as the RC elements which are shown in FIGS. 4 and 5, as a lowpass with a cutoff frequency below the Doppler frequency $f_D$. The impedance 3 which is likewise only shown schematically in FIG. 1 can be accomplished by an ohmic resistance, a constant current source 3' or by a gyrator 3". Preferably in the current- and component-optimized embodiment of the microwave sensor which has a microwave module 6 as shown in FIGS. 4 and 5, only one ohmic resistance is used as the impedance 3. Conversely, when the microwave sensor is to have a somewhat greater range, the impedance 3 is accomplished by a constant current source 3' or by a gyrator 3".

As can be seen in FIG. 2, when the impedance is a constant current source 3' (FIG. 2a) the tap of the working point control, i.e. the voltage countercoupling 10, takes place above the oscillator 2, while when the impedance is a gyrator 3" (FIG. 2b) the tap of the current control 10' takes place below the oscillator 2. The current control 10' consists of an amplifier 13' and a lowpass 14'.

The evaluation circuit 5 which is shown only schematically in FIG. 1 consists of an amplifier 17, a bandpass 18 and a window comparator 19. The amplifier 17 can be made as a two-stage operational amplifier, the bandpass 18 being implemented by RC countercoupling of the operational amplifier. The circuit of the microwave sensor moreover has a voltage regulator 20 with a load resistor 22 connected to its output 21. When the microwave sensor is actuated, i.e. an object moves into the monitored area, the window comparator 19 becomes conductive, so that a load current flows via the load resistor 22. The associated voltage dip by the voltage regulator 20 is immediately compensated by a corresponding rise of the current. The voltage regulator 20 thus provides for a constant operating voltage of the microwave sensor, for the 2-wire microwave sensor shown in FIG. 1 the output signal being on the current or voltage supply 1 in the form of two different currents, closed-circuit current or increased current, with the microwave sensor actuated. Finally, FIG. 1 shows a protective circuit 23 which consists of a transistor as a preregulator and of diodes as overvoltage and reverse voltage protection.

As is shown in FIGS. 2, 3, and 4, the oscillator 2 is connected via a filtering and matching network 24 to ground in order to achieve gain of the useful signal as high as possible. The filtering and matching network 24 contains especially one inductance and a low-resistance resistor connected in series to it per emitter branch.

In order to be able to build the microwave module 6 as easily as possible and with as few components as possible, the collectors 25, 26 of the transistors 7, 8 are blocked by fanshaped triangles 27 as blocking capacitors against the rear copper coating of the microwave module 6. The rear copper coating of the microwave module 6 improves the emission characteristics of the strip line 9, for which the free area on the top 28 of the microwave module 6—especially adjacent to the strip line 9—can be filled with copper. The top surface 28 of the microwave module 6 is connected via contact-making points 29 to the rear copper coating on the bottom. As moreover can be seen from FIG. 5, the high frequency reactors are implemented by meandering lines 30. Additional components such as capacitors or high frequency reactors can thus be omitted or can be implemented especially easily by means of these measures.

What is claimed is:

1. A microwave sensor, comprising:
   a current or voltage supply,
   a self-mixing oscillator comprising a push-pull oscillator with two transistors and configured to transmit a signal and mix the transmitted signal with a received signal to generate a low-frequency mixed signal;
   an impedance connected between the current or voltage supply and the self-mixing oscillator, the low-frequency mixed signal being tapped on the impedance;
   a transmitting and receiving antenna; and
   an evaluation circuit supplied with the frequency mixed signal tapped on the impedance.

2. The microwave sensor as claimed in claim 1, wherein the transmitting and receiving antenna comprises a strip line configured so as to determine the frequency of the push-pull oscillator.

3. The microwave sensor as claimed in claim 1, further comprising:
   voltage counter-coupling including at least one resistor and one lowpass and configured to adjust or stabilize a working point of the microwave sensor.

4. The microwave sensor as claimed in claim 1, further comprising:
   current control including at least one resistor and one lowpass and configured to adjust or stabilize a working point of the microwave sensor.

5. The microwave sensor as claimed in claim 1, further comprising:
   a comparator, and
   a lowpass or an integrator,
   wherein the comparator and the lowpass or the integrator are configured for stabilization of a working point of the microwave sensor.

6. The microwave sensor as claimed in claim 1, wherein the impedance comprises an ohmic resistance.

7. The microwave sensor as claimed in claim 1, wherein the impedance includes a frequency-dependant resistance value.

8. The microwave sensor as claimed in claim 7, wherein the impedance comprises a constant current source.

9. The microwave sensor as claimed in claim 7, wherein the impedance comprises an electronic reactor including a gyrator.

10. The microwave sensor as claimed in claim 2, wherein the transistors comprise bipolar transistors, and
    the strip line is connected to base terminals of the bipolar transistors.

11. The microwave sensor as claimed in claim 2, wherein the strip line is connected to a dielectric resonator.

12. The microwave sensor as claimed in claim 2, wherein the strip line comprises a $\lambda/2$ microstrip line with a copper coating on a rear thereof.

13. The microwave sensor as claimed in claim 1, wherein the evaluation circuit comprises at least one amplifier, at least one bandpass, and at least one comparator including a window comparator.

14. The microwave sensor as claimed in claim 13, wherein the amplifier comprises a two-stage operational amplifier having RC countercoupling.

15. The microwave sensor as claimed in claim 13, wherein the window comparator is configured so as to be de-energized in an idle state.

16. The microwave sensor as claimed in claim 1, further comprising:
    a voltage regulator connected between the current or voltage supply and the impedance; and
    a load resistor connected to a output of the voltage regulator.

* * * * *